United States Patent
Fukui et al.

(10) Patent No.: US 12,309,920 B2
(45) Date of Patent: May 20, 2025

(54) WIRING SUBSTRATE

(71) Applicant: IBIDEN CO., LTD., Gifu (JP)

(72) Inventors: Shogo Fukui, Ogaki (JP); Kosuke Ikeda, Ogaki (JP); Kosei Ichikawa, Ogaki (JP); Ryo Ando, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 237 days.

(21) Appl. No.: 18/062,049

(22) Filed: Dec. 6, 2022

(65) Prior Publication Data

US 2023/0180385 A1 Jun. 8, 2023

(30) Foreign Application Priority Data

Dec. 6, 2021 (JP) ................. 2021-198078

(51) Int. Cl.
*H05K 1/03* (2006.01)
*H05K 1/11* (2006.01)
*H05K 3/46* (2006.01)

(52) U.S. Cl.
CPC ........... *H05K 1/0373* (2013.01); *H05K 1/112* (2013.01); *H05K 3/4661* (2013.01); *H05K 2201/0209* (2013.01); *H05K 2201/0263* (2013.01)

(58) Field of Classification Search
CPC ........ H05K 1/03; H05K 1/0373; H05K 1/112; H05K 3/4661; H05K 2201/0209; H05K 2201/0263
USPC ........................................................ 174/253
See application file for complete search history.

(56) References Cited

U.S. PATENT DOCUMENTS

2021/0335686 A1* 10/2021 Schwab ............ H01L 23/49548

FOREIGN PATENT DOCUMENTS

| JP | 2017-199703 A | 11/2017 |
|---|---|---|
| TW | 201815568 A | 5/2018 |
| TW | 201911983 A | 3/2019 |

OTHER PUBLICATIONS

English translation of Search Report issued Aug. 31, 2023 in corresponding Taiwanese Patent Application No. 111146349, filed Dec. 2, 2022, 1 page.

* cited by examiner

*Primary Examiner* — Tremesha W Burns
(74) *Attorney, Agent, or Firm* — Oblon, McClelland, Maier & Neustadt, L.L.P.

(57) ABSTRACT

A wiring substrate includes an insulating layer including inorganic filler particles and resin, and a conductor layer including a metal film formed on a surface of the insulating layer and having a conductor pattern. The inorganic filler particles include first inorganic filler particles such that each of the first inorganic filler particles has a portion exposed on the surface of the insulating layer and is at least partially separated from the resin, the conductor layer is formed such that a part of the metal film is between the first inorganic filler particles and the resin from the surface of the insulating layer and that a distance between the surface of the insulating layer and the surface of the insulating layer at a deepest part of the part of the metal film is in the range of 0.1 μm to 0.5 μm.

20 Claims, 8 Drawing Sheets

WIRING SUBSTRATE

CROSS-REFERENCE TO RELATED APPLICATIONS

The present application is based upon and claims the benefit of priority to Japanese Patent Application No. 2021-198078, filed Dec. 6, 2021, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2017-199703 describes a wiring substrate that includes an insulating layer in which inorganic insulating filler particles are contained in a thermosetting resin. The entire contents of this publication are incorporated herein by reference.

SUMMARY OF THE INVENTION

According to one aspect of the present invention, a wiring substrate includes an insulating layer including inorganic filler particles and resin, and a conductor layer including a metal film formed on a surface of the insulating layer and having a conductor pattern. The inorganic filler particles include first inorganic filler particles such that each of the first inorganic filler particles has a portion exposed on the surface of the insulating layer and is at least partially separated from the resin, the conductor layer is formed such that a part of the metal film is between the first inorganic filler particles and the resin from the surface of the insulating layer and that the distance between the surface of the insulating layer and the surface of the insulating layer at the deepest part of the part of the metal film is in the range of 0.1 μm to 0.5 μm.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
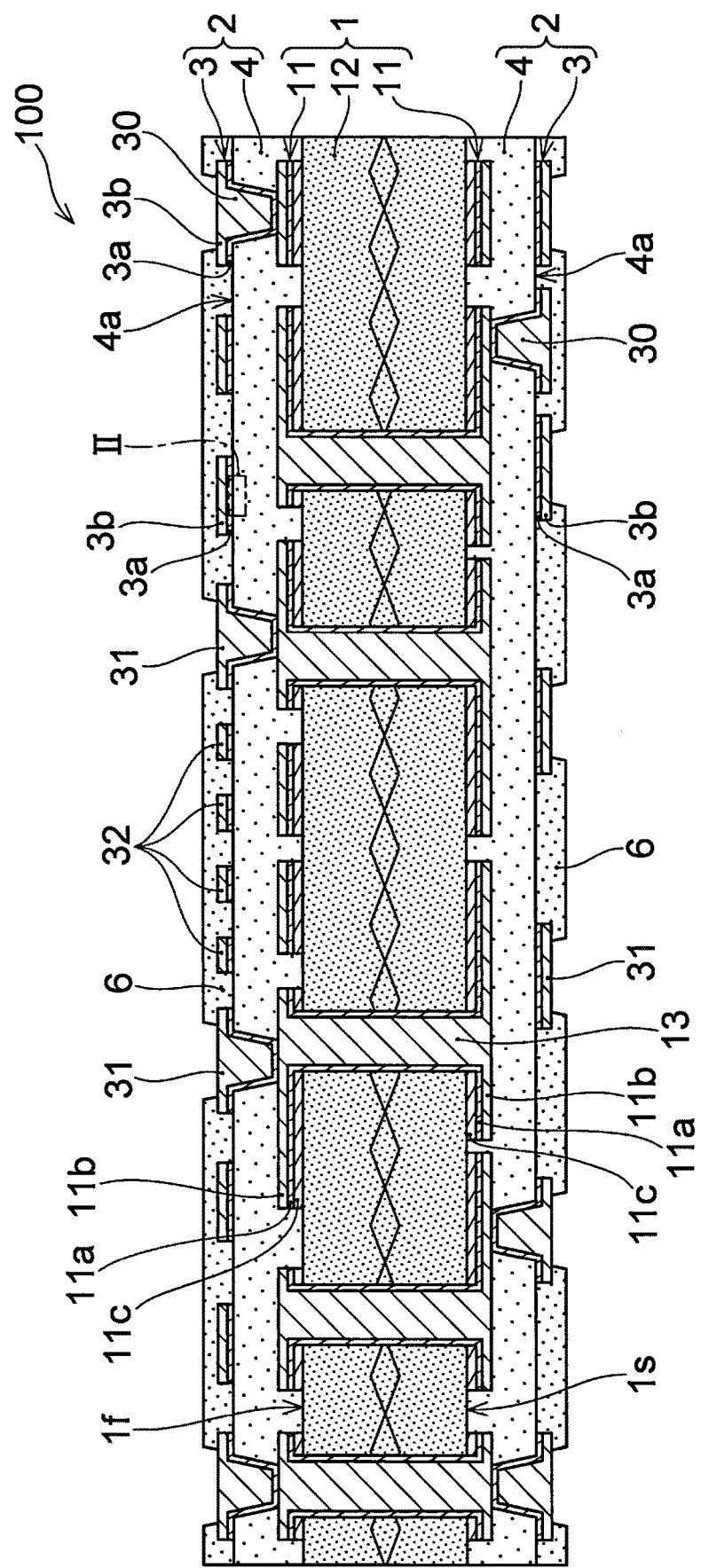
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
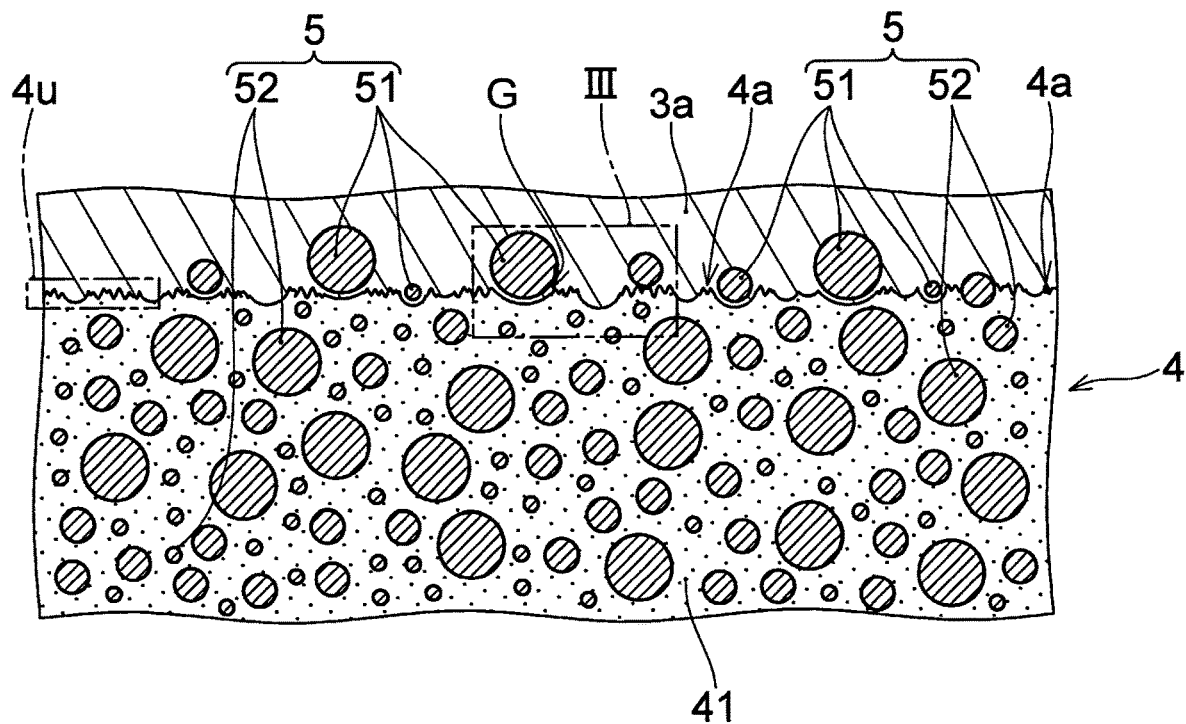
FIG. 2 is a cross-sectional view schematically illustrating an example of a cross section near an interface between an insulating layer and a conductor layer in the wiring substrate according to an embodiment of the present invention.
Figure 3:
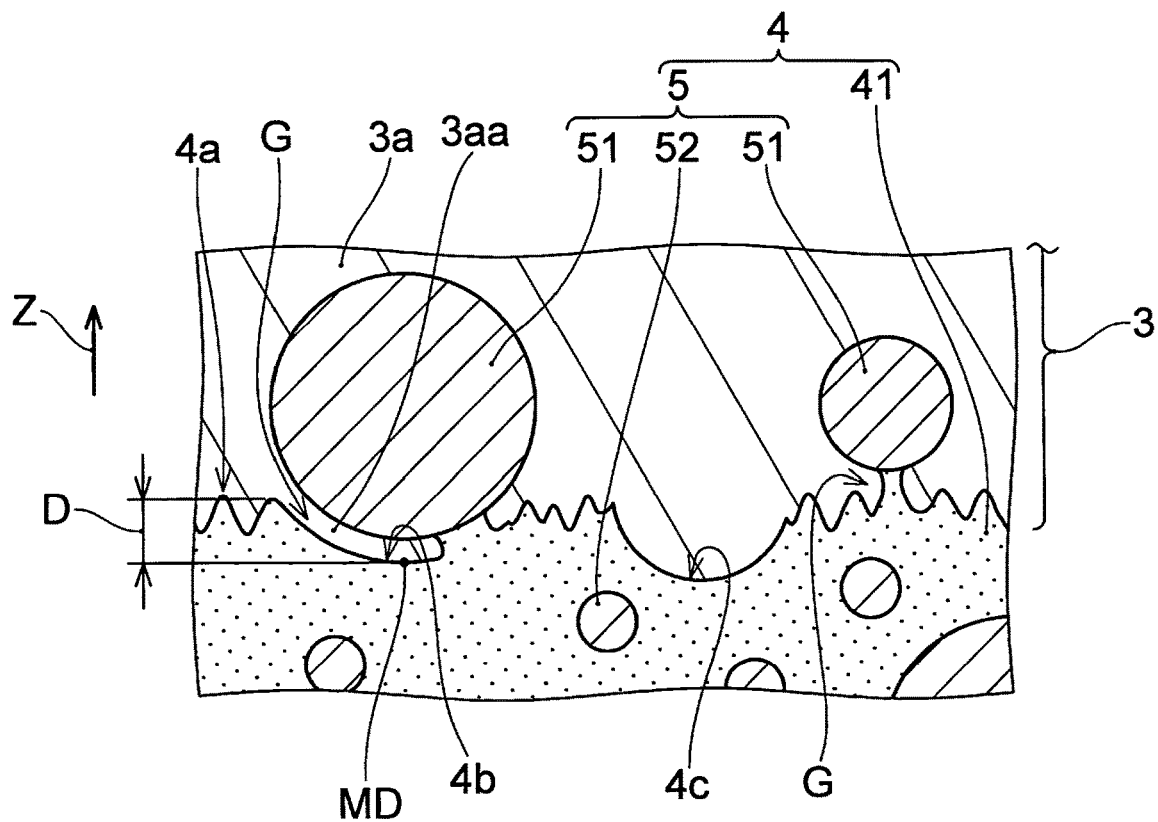
FIG. 3 is an enlarged view of a portion (III) in FIG. 2.

A wiring substrate according to an embodiment of the present invention is described with reference to the drawings. FIG. 1 is a cross-sectional view illustrating a wiring substrate 100, which is an example of the wiring substrate of the embodiment. FIG. 2 schematically illustrates an enlarged cross section near an interface between an insulating layer 4 and a conductor layer (metal film (3a)) in the wiring substrate 100 (for example, a portion (II) in FIG. 1). FIG. 3 illustrates a further enlarged view of a portion (III) of FIG. 2. The wiring substrate 100 is merely an example of the wiring substrate of the present embodiment. A laminated structure, the number of conductor layers, and the number of insulating layers of the wiring substrate of the embodiment are not limited to a laminated structure of the wiring substrate 100 of FIG. 1, the number of conductor layers 3 and the number of insulating layers 4 included in the wiring substrate 100.

As illustrated in FIG. 1, the wiring substrate 100 includes a core substrate 1, and build-up layers 2 that are respectively laminated on two main surfaces (a first surface (1f) and a second surface (is)) of the core substrate 1 opposing each other in a thickness direction of the core substrate 1. The core substrate 1 includes an insulating layer 12, and conductor layers 11 that are respectively formed on both sides of the insulating layer 12. The insulating layer 12 includes through-hole conductors 13 that penetrate the insulating layer 12 and connect the conductor layer 11 on the first surface (1f) side and the conductor layer 11 on the second surface (is) side to each other.

The build-up layers 2 that are respectively formed on the first surface (1f) and the second surface (is) of the core substrate 1 each include an insulating layer 4 and a conductor layer 3 formed on a surface (4a) of the insulating layer 4. The insulating layer 4 includes via conductors 30 that penetrate the insulating layer 4 and connect to each other the conductor layer 11 and the conductor layer 3 that are adjacent to each other via the insulating layer 4. Each o the build-up layers 2 in the example of FIG. 1 includes one insulating layer 4 and one conductor layer 3. However, the wiring substrate 100 of the present embodiment may include build-up layers that each include any number of insulating layers and any number of conductor layers.

In the description of the embodiment, a side farther from the insulating layer 12 in a thickness direction of the wiring substrate 100 is also referred to as an "upper side" or simply "upper," and a side closer to the insulating layer 12 is also referred to as a "lower side" or simply "lower." Further, for the conductor layers and the insulating layers, a surface facing the opposite side with respect to the insulating layer 12 is also referred to as an "upper surface," and a surface facing the insulating layer 12 side is also referred to as a "lower surface."

Each of the insulating layers 4 and the insulating layer 12 contains any insulating resin. Examples of the insulating resin include an epoxy resin, a bismaleimide triazine resin (BT resin), a phenol resin, and the like. Each of the insulating layers may contain a core material (reinforcing material) formed of a glass fiber or an aramid fiber. As illustrated in FIGS. 2 and 3, each of the insulating layers may further contain inorganic filler particles 5 formed of fine particles of silica ($SiO2$), alumina, mullite, or the like. In the present embodiment, at least each of the insulating layers 4 contains multiple inorganic filler particles 5.

In the example of FIG. 1, each of the conductor layers 3 includes a lower layer formed of a metal film (3a) formed on the surface (4a) of the insulating layer 4, and an upper layer formed of a plating film (3b) formed on the metal film (3a). On the other hand, each of the conductor layers 11 includes a lower layer formed of a metal foil (11c) formed on a surface of the insulating layer 12, a middle layer formed of a metal film (11a) formed on the metal foil (11c), and an upper layer formed of a plating film (11b) formed on the metal film (11a). The metal film (3a) and the metal film (11a) are each, for example, an electroless plating film or a sputtering film. The plating film (3b) and the plating film (11b) are each, for example, an electrolytic plating film. Each of the conductor layers 3 and the conductor layers 11 is formed using any metal such as copper or nickel.

The via conductors 30 are integrally formed with the conductor layers 3. Therefore, the via conductors 30 are formed of any metal such as copper or nickel similar to the conductor layers 3 and each have a two-layer structure including a metal film (3a) and a plating film (3b) similar to the conductor layers 3. On the other hand, the through-hole conductors 13 are integrally formed with the conductor layers 11. Therefore, the through-hole conductors 13 are formed of any metal such as copper or nickel similar to the conductor layers 11. The through-hole conductors 13 are formed of the metal film (11a) and the plating film (11b) that respectively form the middle layer and the upper layer of each of the conductor layers 11.

Each of the conductor layers 3 and the conductor layers 11 includes predetermined conductor patterns. In the example of FIG. 1, the conductor layers 3 include conductor pads 31. Electrodes of an active component (not illustrated in the drawings) such as a semiconductor integrated circuit device or a transistor, or a passive component (not illustrated in the drawings) such as an electrical resistance are connected to the conductor pads 31. The conductor pads 31 may be connected to another wiring substrate such as a motherboard of an electrical device in which the wiring substrate 100 is used.

The conductor layer 3 on the first surface (1f) side of the core substrate 1 includes multiple wiring patterns 32 adjacent to each other. In the wiring substrate 100, as will be described later, it is thought that insulation between the conductor patterns included in the conductor layer 3 is improved. That is, it is thought that a short circuit failure between the wiring patterns 32 is unlikely to occur. Therefore, the multiple wiring patterns 32 are formed with narrow wiring widths and intervals. For example, the multiple wiring patterns 32 may be formed according to a wiring rule of (5 μm)/(5 μm), regarding a wiring rule defined by a combination (L/S) of a minimum wiring width (L) and a minimum wiring interval (S). Therefore, the conductor layer 3 includes the multiple wiring patterns 32 having a (minimum wiring width (L))/(minimum wiring interval (S)) of (5 μm)/(5 μm).

A solder resist 6 is formed on the insulating layer 4 and the conductor layer 3 on each of the first surface (1f) side and the second surface (is) side of the core substrate 1. Openings exposing the conductor pads 31 are provided in the solder resists 6. The solder resists 6 are each formed of, for example, a photosensitive epoxy resin or polyimide resin, or the like. A surface protection film (not illustrated in the drawings) may be provided on surfaces of the conductor pads 31 exposed in the openings of the solder resists 6 to prevent corrosion or oxidation of the surfaces of the conductor pads 31. The surface protection film may have, for example, a single-layer structure or a multilayer structure formed of Au, Ni/Au, Ni/Pd/Au or the like.

As illustrated in FIG. 2, the surface (4a) of the insulating layer 4 has fine unevenness (4u). As will be described later, the unevenness (4u) is formed by subjecting the surface (4a) to a roughening treatment using, for example, a chemical method. The unevenness (4u) may be formed by peeling off some of the multiple inorganic filler particles 5 exposed on the surface (4a) of the insulating layer 4 by the roughening treatment.

The insulating layer 4 of the wiring substrate 100 contains multiple inorganic filler particles 5 and a resin part 41 surrounding the multiple inorganic filler particles 5. The resin part 41 contains as a main component an epoxy resin, a BT resin, a phenol resin, or the like exemplified above as a resin forming the insulating layer 4. By adding the inorganic filler particles 5 formed of silica, alumina, or the like to the resin, mechanical strength and/or thermal conductivity of the insulating layer 4 may be increased. Further, by adjusting an additive amount of the inorganic filler particles 5, it may be possible to adjust a thermal expansion coefficient of the insulating layer 4.

In the wiring substrate 100 of the present embodiment, the multiple inorganic filler particles 5 include first inorganic filler particles 51. The first inorganic filler particles 51 are some inorganic filler particles among the multiple inorganic filler particles 5, and are inorganic filler particles that each include a portion exposed on the surface (4a) of the insulating layer 4 and are each at least partially separated from the resin part 41 of the insulating layer 4. That is, at least a part of a surface of each of the first inorganic filler particles 51 is separated from the resin part 41 and is not in contact with the resin part 41. The surface of each of the first inorganic filler particles 51 has a portion that is not in contact with the resin part 41. For example, by dissolving a portion of the resin part 41 in contact with an inorganic filler particle 5, the inorganic filler particle 5 in contact with the dissolved resin turns into a state called a first inorganic filler particle 51. As illustrated in FIGS. 2 and 3, the multiple inorganic filler particles 5 include the multiple first inorganic filler particles 51.

That an inorganic filler particle 5 is "separated from the resin part 41" means that a portion of the surface of the inorganic filler particle 5 opposing (facing) the resin part 41 is not in contact with the resin part 41. That is, a state is intended in which a portion of the surface of the inorganic filler particle 5 opposing the resin part 41 is not in contact with the resin part 41 even though it opposes the resin part 41. Therefore, an inorganic filler particle 5 of which only a portion of a surface opposing the conductor layer 3 (metal film (3*a*)) is not in contact with the resin part 41 does not belong to the first inorganic filler particles 51.

In the example of FIGS. 2 and 3, the multiple inorganic filler particles 5 also include inorganic filler particles that are not the first inorganic filler particles 51. Among the multiple inorganic filler particles 5, inorganic filler particles other than the first inorganic filler particles 51 are also referred to as second inorganic filler particles 52. Each of the second inorganic filler particles 52 is an inorganic filler particle of which an entire surface portion opposing the resin part 41 is in contact with the resin part 41. Each of the second inorganic filler particles 52 is substantially entirely surrounded by the resin part 41 and substantially entirely embedded in the insulating layer 4.

Although the surface of each of the first inorganic filler particles 51 includes a portion separated from the resin part 41, as illustrated in FIG. 3, a portion of the surface of each of the first inorganic filler particles 51 may be in contact with the resin part 41. The surfaces of at least some of the multiple first inorganic filler particles 51 are partially in contact with the resin part 41 and are connected to the resin part 41. That is, at least some of the first inorganic filler particles 51 are connected to a main body portion of the insulating layer 4 (a portion other than the first inorganic filler particles 51 in the insulating layer 4). Since such first inorganic filler particles 51 are contained in the insulating layer 4, it is thought that adhesion strength between the metal film (3*a*), that is, the conductor layer 3, and the insulating layer 4 is improved. The reason for this is described below.

Since a portion of the surface of each of the first inorganic filler particles 51 is separated from the resin part 41, as illustrated in FIG. 3, there is a gap (G) between each of the first inorganic filler particles 51 and the resin part 41, which forms the main body portion of the insulating layer 4. A gap (G) is formed, for example, by dissolving a portion of the resin part 41 in contact with an inorganic filler particle 5. The gaps (G) exist on the surface (4*a*) of the insulating layer 4. Then, the metal film (3*a*) forming the conductor layer 3 is formed on the surface (4*a*). Since the gaps (G) exist on the surface (4*a*), as illustrated in FIGS. 2 and 3, a part (3*aa*) of the metal film (3*a*) enters (the gaps (G)) between the first inorganic filler particles 51 and the resin part 41 from the surface (4*a*) of the insulating layer 4. The part (3*aa*) of the metal film (3*a*) enters or penetrates to a back side (a portion facing the resin part 41) of each of the first inorganic filler particles 51 from the surface (4*a*). That is, the part of the conductor layer 3 (the part (3*aa*) of the metal film (3*a*)) is formed not only on surfaces of the resin part 41 and the inorganic filler particles 5 facing the metal film (3*a*), but is also formed between the first inorganic filler particles 51 and the resin part 41.

On the other hand, as described above, some of the first inorganic filler particles 51 are connected to the resin part 41 that forms the main body portion of the insulating layer 4. Therefore, when the metal film (3*a*) is formed in the gaps (G), it is thought that a substantial contact area between the metal film (3*a*) (a part of the conductor layer 3) and the insulating layer 4 is increased. Further, it is thought that a movement of the metal film (3*a*) formed in the gaps (G) from the surface (4*a*) of the insulating layer 4 in a peeling direction is hindered by the first inorganic filler particles 51. Therefore, it is thought that the adhesion strength between the metal film (3*a*), that is, the conductor layer 3, and the insulating layer 4 is improved.

From such a point of view of improving the adhesion strength between the conductor layer 3 and the insulating layer 4, the metal film (3*a*) is preferably formed using a method that allows the metal film (3*a*) to be also easily formed in the gaps (G). For example, the metal film (3*a*) may be an electroless plating film formed by electroless plating. In electroless plating performed in a plating solution, it is thought that the metal film (3*a*) is easily formed in the gaps (G) compared to sputtering or the like.

In this way, in the present embodiment, the metal film (3*a*) is also formed between the first inorganic filler particles 51 and the resin part 41. Therefore, as described above, it is thought that the adhesion strength between the conductor layer 3 and the insulating layer 4 is improved. However, when the metal film (3*a*) has excessively entered from the surface (4*a*) of the insulating layer 4, in the patterning of the conductor layer 3 in which an unwanted portion of the metal film (3*a*) is removed, it may be difficult to remove the metal film (3*a*) in a region in which the conductor patterns such as the wiring patterns 32 illustrated in FIG. 1 are not formed. For example, it may be possible that an etching solution that dissolves the metal film (3*a*) cannot flow deep into the gaps (G), and the metal film (3*a*) remains in the gaps (G). In this way, when the metal film (3*a*) remains, insulation may deteriorate between the conductor patterns of the conductor layer 3, for example, between adjacent wiring patterns 32, and, for example, a short circuit failure or the like may occur.

However, in the present embodiment, a distance (D) between a deepest part (MD) of the part (3*aa*) of the metal film (3*a*) from the surface (4*a*) of the insulating layer 4 and the surface (4*a*) is 0.1 μm or more and 0.5 μm or less. That is, the insulating layer 4 and/or the metal film (3*a*) are formed such that a distance between the surface (4*a*) and a point farthest from the surface (4*a*) in the metal film (3*a*) interposed between the resin part 41 of the insulating layer 4 and a first inorganic filler particle 51 is 0.1 μm or more and 0.5 μm or less.

For example, as the resin forming the resin part 41 of the insulating layer 4, a resin is selected that contains, at an appropriate ratio, an easily soluble component and a hardly soluble component with respect to a predetermined solvent. Then, by exposing the surface (4*a*) of the insulating layer 4 to the predetermined solvent, depths of the gaps (G) relative to the surface (4*a*) is adjusted. Then, for example, a plating condition for forming the metal film (3*a*) is adjusted so as to fill the gaps (G) including the deepest parts (D) having the above-described distances (D) relative to the surface (4*a*). When the distances (D) are 0.1 μm or more, it is thought that the effect of improving the adhesion between the conductor layer 3 and the insulating layer 4 as described above is obtained. Further, when the distances (D) are 0.5 μm or less, it is thought that the metal film (3*a*) is unlikely to remain in the gaps (G). Therefore, according to the present embodiment, it may be possible to improve the adhesion strength between the insulating layer and the conductor layer while suppressing deterioration in insulation between the conductor patterns.

A "deepest part (MD)" is a point in the part (3*aa*) of the metal film (3*a*) that has entered into a gap (G), the point being farthest from the surface (4*a*) of the insulating layer 4 in the thickness direction (the Z direction) of the wiring substrate 100. A "distance (D) between a deepest part (MD)

and the surface (4a)" is a length in the Z direction between the deepest part (MD) and the surface (4a). The "surface (4a)" in these definitions for a "deepest part (MD)" and a "distance (D) between a deepest part (MD) and the surface (4a)" is a point on a surface of the resin part 41 that is in contact with the part (3aa) of the metal film (3a) as a target and is positioned farthest from the deepest part (MD) in the Z direction.

When there are multiple first inorganic filler particles 51 as in the example of FIGS. 2 and 3, the part (3aa) of the metal film (3a) around at least one first inorganic filler particle 51 has a distance (D) of 0.1 nm or more and 0.5 nm or less between the deepest part (MD) and the surface (4a). Distances (D) of all the deepest parts (MD) of the part (3aa) of the metal film (3a) surrounding the multiple inorganic filler particles 51 may be 0.1 µm or more and 0.5 µm or less relative to the surface (4a).

The surface (4a) of the insulating layer 4 includes multiple recesses (4b) that are recessed toward the opposite side with respect to the metal film (3a). Some of the first inorganic filler particles 51 have partially entered into the recesses (4b). A gap (G) forms a part of a recess (4b). In the example of FIG. 3, for the first inorganic filler particle 51 on the left side, the part (3aa) of the metal film (3a) enters into a deepest part of the recess (4b). It may be possible that the adhesion strength between the conductor layer 3 and the insulating layer 4 is further improved.

There are also recesses (4c), into which the first inorganic filler particles 51 have not entered, on the surface (4a) of the insulating layer 4. Even in such recesses (4c), the contact area between the metal film (3a) and the insulating layer 4 is increased at least compared to that in a case of a flat part. Therefore, it is thought that the recesses (4c) that do not contain the first inorganic filler particles 51 also contribute to the improvement of the adhesion strength between the conductor layer 3 and the insulating layer 4. Further, since the recesses (4c) are not blocked by the inorganic filler particles 5, in the patterning of the conductor layer 3 in which an unwanted portion of the metal film (3a) is removed, the metal film (3a) in the recesses (4c) is easily exposed to, for example, an etching solution that dissolves the metal film (3a). Therefore, it is thought that the metal film (3a) is unlikely to remain in the recesses (4c) in a region in which the conductor patterns of the conductor layer 3 are not formed. The recesses (4c) that do not contain the first inorganic filler particles 51 may be formed, for example, by removing the inorganic filler particles 5 exposed on the surface (4a) of the insulating layer 4.

Figure 4:
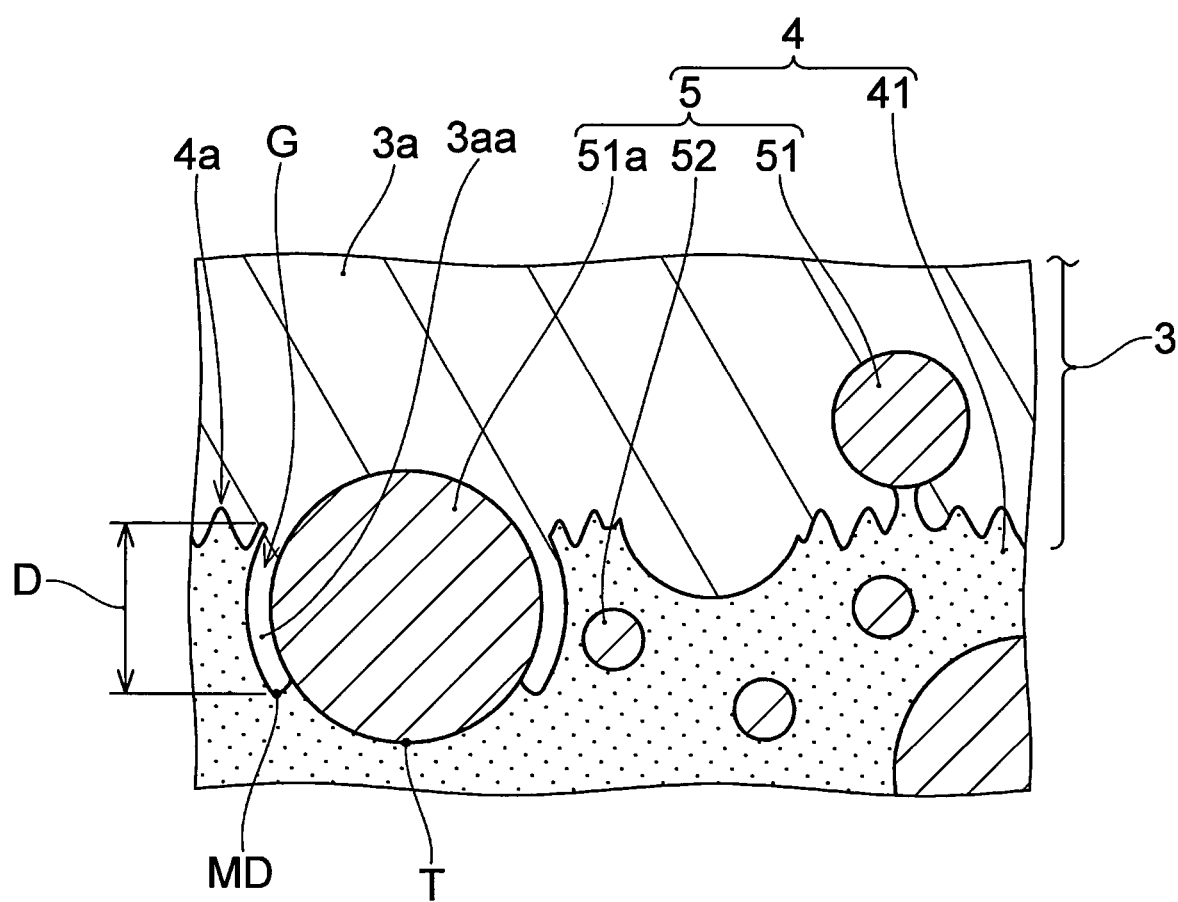
FIG. 4 is a cross-sectional view schematically illustrating another example of a cross section near an interface between an insulating layer and a conductor layer in a wiring substrate according to an embodiment of the present invention.

FIG. 4 schematically illustrates another example of a cross section near an interface between the insulating layer 4 and the conductor layer 3 in the wiring substrate of the present embodiment. FIG. 4 illustrates a region near the interface between the insulating layer 4 and the conductor layer 3 corresponding to the region illustrated in FIG. 3. In the example of FIG. 4, most of a first inorganic filler particle (51a) on the left side is embedded in the insulating layer 4. However, a gap (G) between the first inorganic filler particle (51a) and the resin part 41 is not formed up to a front end part (T) of the first inorganic filler particle (51a) on the opposite side with respect to the conductor layer 3. Therefore, the part (3aa) of the metal film (3a) also does not reach the front end part (T) of the first inorganic filler particle (51a). As a result, the part (3aa) of the metal film (3a) illustrated in FIG. 4 also has a distance (D) of 0.1 µm or more and 0.5 µm or less between the deepest part (MD) and the surface (4a) of the insulating layer 4. In this way, in the present embodiment, the part (3aa) of the metal film (3a) entering the gaps (G) does not have to enter to the front end parts of the first inorganic filler particles on the opposite side with respect to the conductor layer.

Figure 5:
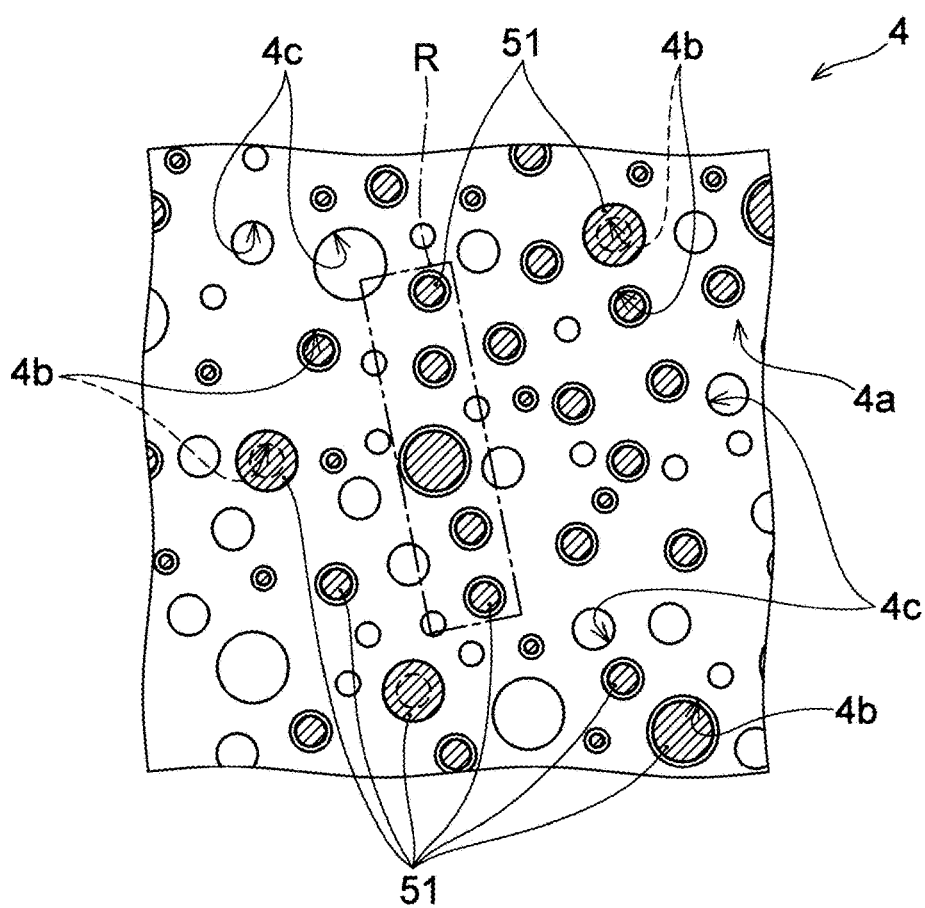
FIG. 5 is a plan view schematically illustrating a surface of an insulating layer in a wiring substrate according to an embodiment of the present invention.

FIG. 5 schematically illustrates the surface (4a) of the insulating layer 4 of the wiring substrate 100. Although FIG. 5 is a plan view, the first inorganic filler particles 51 are hatched with diagonal lines for ease of understanding. As illustrated in FIG. 5, the multiple first inorganic filler particles 51 are exposed on the surface (4a) of the insulating layer 4. Further, the multiple recesses (4b) and the multiple recesses (4c) are formed on the surface (4a). Some of the multiple first inorganic filler particles 51 have entered into the recesses (4b). Recesses (4b) illustrated with broken lines are recesses (4b) hidden by the first inorganic filler particles 51.

In the wiring substrate of the present embodiment, the surface (4a) of the insulating layer 4 may include a region in which there are 5 or more first inorganic filler particles 51 per 10 µm. For example, in FIG. 5, a region (R) of which a contour is indicated with a one-dot chain line includes five first inorganic filler particles 51 aligned along a longitudinal direction of the region (R). Here, the region (R) has a length shorter than 10 µm in the longitudinal direction. That is, there are at least 5 first inorganic filler particles 51 per 10 µm in the region (R). The surface (4a) of the insulating layer 4 in the example of FIG. 5 includes a region, such as the region (R), in which there are 5 or more first inorganic filler particles 51 per 10 µm (a forming density of five first inorganic filler particles 51 per 10 µm is also referred to as a "density (C)" in the following). In the example of FIG. 5, since the first inorganic filler particles 51 exist on the surface (4a) of the insulating layer 4 at a density equal to or higher than the density (C), a sufficient effect of improving the adhesion strength between the conductor layer 3 and the insulating layer 4 described above due to the first inorganic filler particles 51 is obtained.

A region in which the first inorganic filler particles 51 exist at a density equal to or higher than the density (C) preferably exists on the surface (4a) at an interface between the insulating layer 4 and a conductor pattern of the conductor layer 3 (see FIG. 1). However, when a region that includes the first inorganic filler particles 51 at a density equal to or higher than the density (C) exists somewhere on the surface (4a), it is thought that a region that includes the first inorganic filler particles 51 at a density close to the density (C) also exists at an interface portion with the conductor layer 3 on the surface (4a). Therefore, the surface (4a) has a region that includes the first inorganic filler particles 51 at a density equal to or higher than the density (C) at any location.

As described above, in the present embodiment, since the insulating layer 4 contains the multiple inorganic filler particles 5 including the first inorganic filler particles 51 and a part of the metal film (3a) is formed between the first inorganic filler particles 51 and the resin part 41, it is thought that the adhesion strength between the conductor layer 3 (see FIG. 1) and the insulating layer 4 is improved. In addition, when the surface (4a) of the insulating layer 4 includes the first inorganic filler particles 51 at a density equal to or higher than the density (C), it is thought that the adhesion strength between the conductor layer 3 and the insulating layer 4 is further improved. Even when the wiring widths of the wiring patterns 32 (see FIG. 1) become smaller along with miniaturization of the conductor patterns, it is thought that the wiring patterns 32 are unlikely to peel off from the insulating layer 4. Further, even when the additive amount of the inorganic filler particles 5 is increased in order to reduce the thermal expansion coefficient of the insulating layer 4, it is thought that the wiring patterns 32 are unlikely to peel off from the insulating layer 4.

On the other hand, in the wiring substrate of the present embodiment, the surface (4a) of the insulating layer 4 may have an arithmetic mean roughness (Ra) of 0.05 μm or more and 0.5 μm or less. When the surface (4a) of the insulating layer 4 has such a relatively small surface roughness, an unwanted portion (a portion that does not form a conductor pattern of the conductor layer 3) of the metal film (3a) (see FIG. 1) formed on the surface (4a) is easily removed as intended. That is, since a deep recess that makes removal of the metal film (3a) formed therein difficult is unlikely to exist on the surface (4a), an unwanted portion of the metal film (3a) is appropriately removed, for example, by etching. Therefore, the insulation between the conductor patterns (for example, the wiring patterns 32 and the like) of the conductor layer 3 is unlikely to deteriorate, and a short circuit failure is unlikely to occur.

Further, since the surface roughness of the surface (4a) of the insulating layer 4 is relatively small, it is thought that a surface roughness of the conductor layer 3 on the insulating layer 4 side is also relatively small. Therefore, for example, in transmission of a high frequency signal, even when a transmission signal is affected by a skin effect, it is thought that deterioration in transmission characteristics or the like due to a substantial increase in impedance is unlikely to occur.

In the present embodiment, regardless of the density of the first inorganic filler particles 51 and the surface roughness of the insulating layer 4, distances of the deepest parts (MD) (see FIG. 3) of the part (3aa) of the metal film (3a) around the first inorganic filler particles 51 relative to the surface (4a) of the insulating layer 4 are 0.1 μm or more and 0.5 μm or less. Therefore, it is thought that a short circuit failure between the conductor patterns of the conductor layer 3 is suppressed.

The surface (4a) of the insulating layer 4 has an arithmetic mean roughness (Ra) of 0.05 μm or more and 0.5 μm or less as an average value of the entire surface (4a). Therefore, the surface (4a) has, for example, an arithmetic mean roughness (Ra) of 0.05 μm or more and 0.5 μm or less for a surface roughness measured from one edge of the surface (4a) to the other edge on the opposite side with respect to the one edge. That is, the surface (4a) of the insulating layer 4 has an arithmetic mean roughness (Ra) of 0.05 μm or more and 0.5 μm or less as a surface roughness including also the first inorganic filler particles 51. The average value of the arithmetic mean roughness (Ra) of the entire surface (4a) may be obtained as an average value of arithmetic mean roughnesses (Ra) measured at all five places including four corner portions and a center portion of the surface (4a).

For example, when the conductor patterns such as the wiring patterns 32 are formed according to a wiring rule of (15 μm)/(15 μm), even when the surface (4a) of the insulating layer 4 has an arithmetic mean roughness (Ra) of 0.5 μm, it is thought that a short circuit failure is unlikely to occur between the conductor patterns. On the other hand, when the surface (4a) of the insulating layer 4 has an even smaller arithmetic mean roughness (Ra) of 0.05 μm, even when the conductor patterns such as the wiring patterns 32 are formed according to the wiring rule of (3 μm)/(3 μm) described above, it is thought that a short circuit failure is unlikely to occur between the conductor patterns. Therefore, the conductor patterns such as the wiring patterns 32 included in the conductor layer 3 has a minimum wiring width (L) and a minimum wiring interval (S) each of 3 μm or more and 15 μm or less.

A content rate of the multiple inorganic filler particles in the insulating layer 4 is, for example, 65% or more and 80% or less. When the inorganic filler particles 5 exist in the insulating layer 4 at such a content rate, it is thought that the first inorganic filler particles 51 are likely to exist at a density equal to or higher than the density (C) described above, and that a predetermined function due to the resin part 41 such as a binding function between the inorganic filler particles 5 is appropriately exhibited. In FIGS. 2-5, each of the inorganic filler particles 5 is drawn as having a spherical shape. However, each of the inorganic filler particles 5 may have any shape. The inorganic filler particles 5 have particle sizes of, for example, about 0.01 μm-5 μm.

Figure 6:
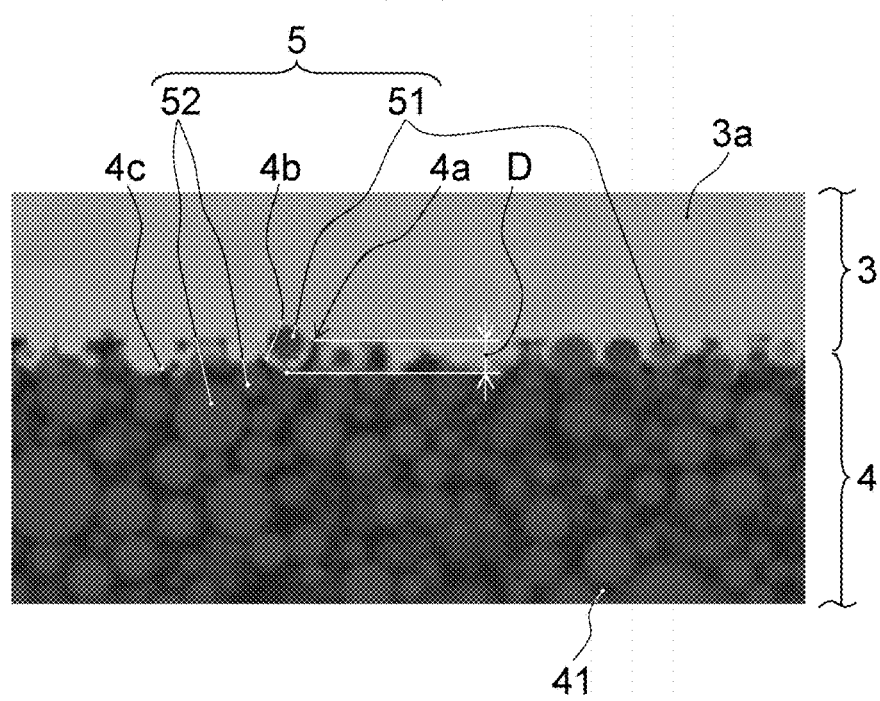
FIG. 6 is a photographed image of a cross section near an interface between an insulating layer and a conductor layer in a working example according to an embodiment of the present invention.

FIG. 6 shows a photographed image of a cross section near an interface between the insulating layer 4 and the metal film (3a) (which forms the conductor layer 3) in a working example of the wiring substrate of the embodiment.

As shown in FIG. 6, the insulating layer 4 contains the multiple inorganic filler particles 5, and some (the first inorganic filler particles 51) of the multiple inorganic filler particles 5 each have a portion that is separated from the resin part 41 of the insulating layer 4. The insulating layer 4 contains the multiple first inorganic filler particles 51. The surface (4a) of the insulating layer 4 includes the recesses (4b) into which the first inorganic filler particles 51 have entered and the recesses (4c) that do not contain the first inorganic filler particles 51.

The metal film (3a) is also formed between the first inorganic filler particles 51 and the resin part 41. The first inorganic filler particles 51 appear to be completely separated from the resin part 41. However, the first inorganic filler particles 51 may be connected to the resin part 41 in a region not photographed. As shown in the working example of FIG. 6, in the present embodiment, a part of the metal film (3a) enters between the first inorganic filler particles 51 and the resin part 41 of the insulating layer 4. Further, in the present embodiment, the distances (D) of the deepest parts of the metal film (3a) interposed between the first inorganic filler particles 51 and the resin part 41 relative to the surface (4a) of the insulating layer 4 are 0.1 μm or more and 0.5 μm or less. Therefore, good adhesion strength between the conductor layer 3 (metal film (3a)) and the insulating layer 4 and good insulation between the conductor patterns included in the conductor layer 3 are obtained.

Next, an example of a method for manufacturing the wiring substrate of the embodiment is described with reference to FIGS. 7A-7G, using the wiring substrate 100 of FIG. 1 as an example.

Figure 7A:
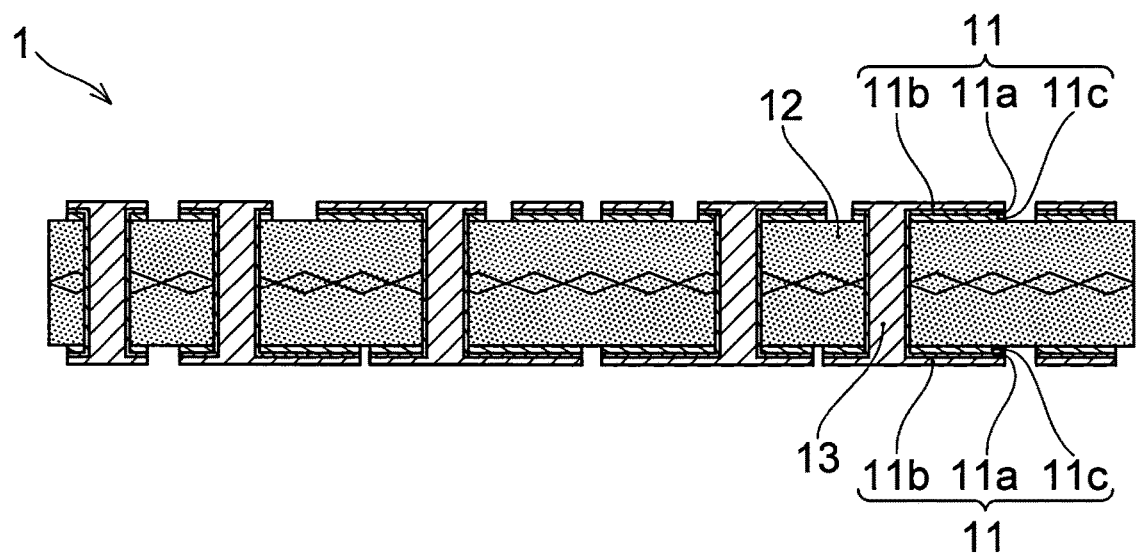
FIG. 7A is a cross-sectional view illustrating an example of a manufacturing process of a wiring substrate according to an embodiment of the present invention.

As illustrated in FIG. 7A, a starting substrate (for example, a double-sided copper-clad laminated plate) that includes an insulating layer, which is to become the insulating layer 12 of the core substrate 1, and the metal foils (11c) that are respectively laminated on both sides of the insulating layer is prepared, and the conductor layers 11 and the through-hole conductors 13 of the core substrate 1 are formed. Through holes are formed at formation positions of the through-hole conductors 13, for example, by drilling, and the metal film (11a) is formed in the through holes and on the metal foils (11c), for example, by electroless plating. Then, the plating film (11b) is formed by electrolytic plating using the metal film (11a) as a power feeding layer. As a result, the conductor layers 11, each having a three-layer structure, and the through-hole conductors 13 are formed. After that, the core substrate 1 having predetermined conductor patterns is obtained by patterning the conductor layers 11 using a subtractive method.

Figure 7B:
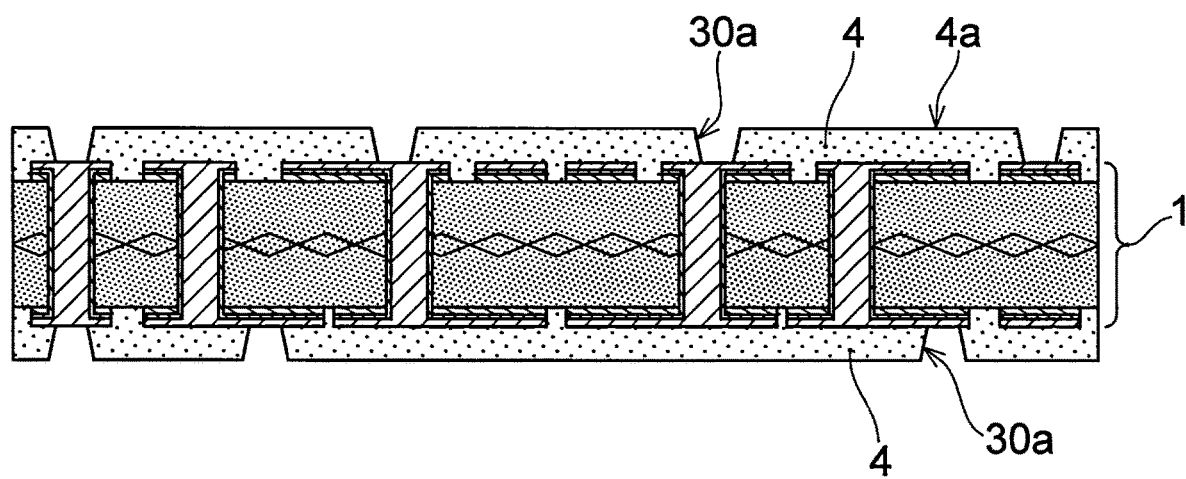
FIG. 7B is a cross-sectional view illustrating an example of a manufacturing process of a wiring substrate according to an embodiment of the present invention.
Figure 7C:
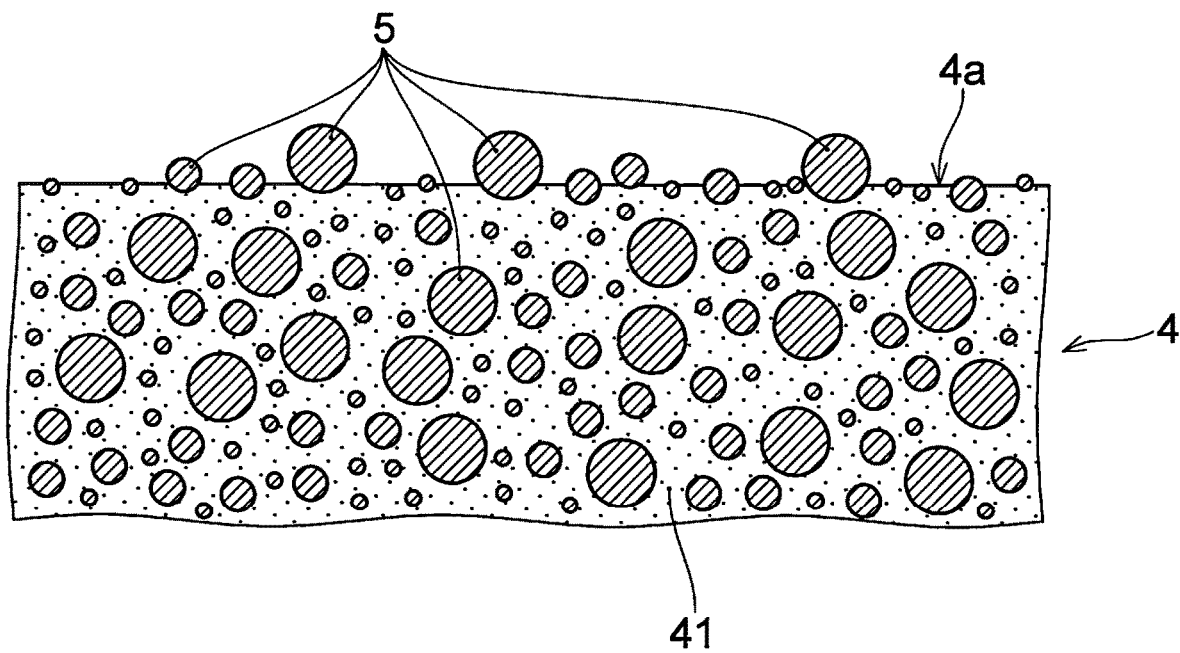
FIG. 7C is a cross-sectional view illustrating an example of a manufacturing process of a wiring substrate according to an embodiment of the present invention.

As illustrated in FIGS. 7B and 7C, the insulating layer 4 containing the multiple inorganic filler particles 5 and the resin part 41 surrounding the multiple inorganic filler particles 5 is formed. FIG. 7C illustrates an enlarged cross section of the insulating layer 4 near the surface (4*a*) in the state of FIG. 7B.

In the formation of the insulating layers 4, for example, a film-like epoxy resin is laminated on both sides of the core substrate 1 and heat and pressure are applied thereto. As the resin forming the insulating layer 4, for example, a resin is selected that contains, at an appropriate ratio, an easily soluble component and a hardly soluble component with respect to a solvent used in a desmear treatment or a roughening treatment performed in a subsequent process. By doing so, the gaps (G) (see FIG. 7D) (to be described later) having moderate depths are formed.

In the formation of the insulating layers 4, for example, a film-like resin in which the multiple inorganic filler particles 5 are contained in a resin such as an epoxy resin is used. For example, an epoxy resin containing the inorganic filler particles 5 at a content rate of 65%-80% is used. The resin part 41 of the insulating layer 4 is formed by a resin component formed of an epoxy resin or the like in the film-like resin. In the insulating layer 4, through holes (30*a*) for forming the via conductors are formed by, for example, irradiation with $CO_2$ laser.

As illustrated in FIG. 7C, the multiple inorganic filler particles 5 exist in the insulating layer 4 and near the surface (4*a*) of the insulating layer 4. Some of the multiple inorganic filler particles 5 are substantially entirely or partially exposed from the surface (4*a*) of the insulating layer 4. As illustrated in FIG. 7C, until after the formation of the through holes (30*a*), the insulating layer 4 has a substantially flat surface (4*a*) except for portions where the inorganic filler particles 5 exist.

After the formation of the through holes (30*a*), when necessary, a desmear treatment is performed in which resin residues (smears) generated by the formation of the through holes (30*a*) are removed. For example, the smears in the through holes (30*a*) are removed by exposing inner walls of the through holes (30*a*) to a processing liquid such as an alkaline permanganate solution. In the desmear treatment, the surface (4*a*) of the insulating layer 4 is also exposed to the processing liquid.

Figure 7D:
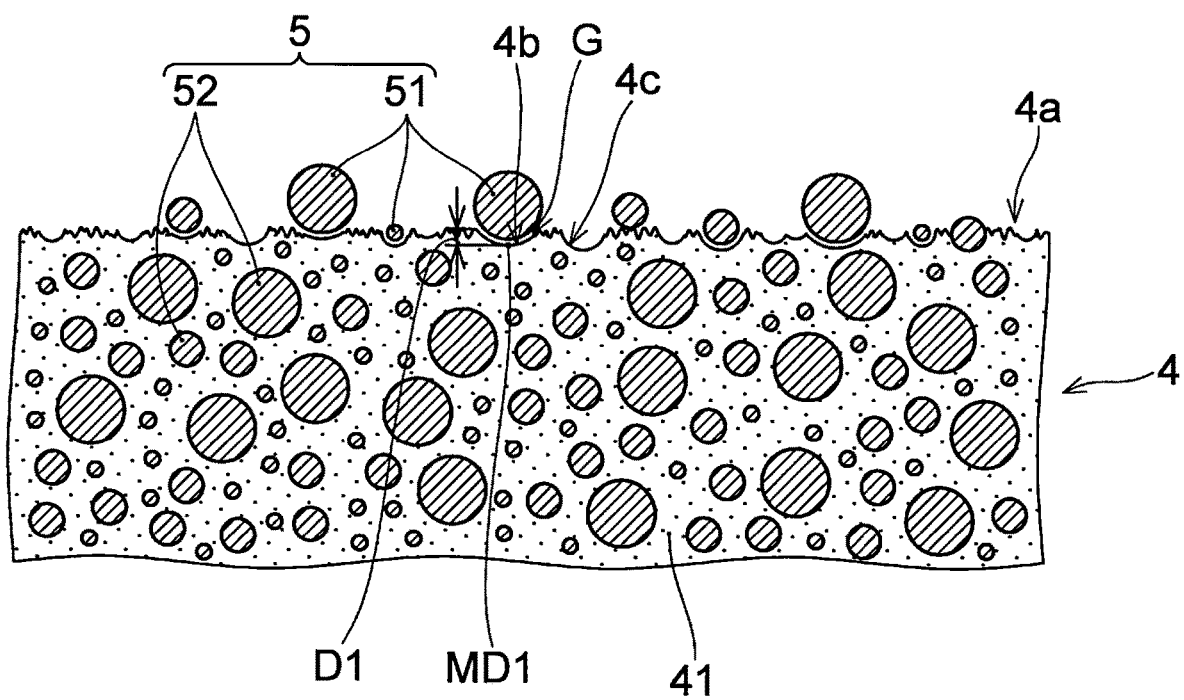
FIG. 7D is a cross-sectional view illustrating an example of a manufacturing process of a wiring substrate according to an embodiment of the present invention.

As illustrated in FIG. 7D, the surface (4*a*) of the insulating layer 4 is roughened to have a predetermined surface roughness. Similar to FIG. 7C, FIG. 7D illustrates an enlarged cross section near the surface (4*a*) of the insulating layer 4. By the roughening of the surface (4*a*), the adhesion strength between the insulating layer 4 and the conductor layer 3 (see FIG. 7G) formed on the surface (4*a*) is improved to some extent.

For example, the surface (4*a*) of the insulating layer 4 is subjected to an alkaline permanganate solution treatment using a processing liquid similar to that used in the above-described desmear treatment. The surface (4*a*) of the insulating layer 4 may be roughened to a desired surface roughness in the desmear treatment described above.

As illustrated in FIG. 7D, the first inorganic filler particles 51, which are inorganic filler particles partially separated from the resin part 41 of the insulating layer 4, are provided by a roughening treatment and/or a desmear treatment. On the other hand, in the insulating layer 4, the second inorganic filler particles 52, which are inorganic filler particles other than the first inorganic filler particles 51, remain in the state before the surface (4*a*) is roughened. In the example of FIG. 7D, for example, due to the roughening of the surface (4*a*), for example, the inorganic filler particles 5 existing on the surface (4*a*) are detached and the recesses (4*c*) are formed.

The first inorganic filler particles 51 are provided by forming a partial gap (G) between each of some inorganic filler particles 5, which are among the multiple inorganic filler particles 5 and exist on the surface (4*a*) of the insulating layer 4, and the resin part 41. That is, in the roughening treatment and/or the desmear treatment of the surface (4*a*) of the insulating layer 4, the resin part 41 forming the surface (4*a*) of the insulating layer 4 is selectively dissolved, and the dissolved portion is removed. By selectively removing the resin part 41 around the inorganic filler particles 5 existing near the surface (4*a*), the gaps (G) are formed between the inorganic filler particles 5 and the resin part 41, and these inorganic filler particles 5 turn into the first inorganic filler particles 51 At the same time, the recesses (4*b*) including the gaps (G) are formed.

In manufacturing the wiring substrate of the embodiment, gaps (G) having depths (D1) (distances of deepest parts (MD1) of the gaps (G) from the surface (4*a*) of the insulating layer 4) of 0.1 μm or more and 0.5 μm or less from the surface (4*a*) of the insulating layer 4 are formed. For example, as the resin forming the resin part 41, as described above, by selecting a resin containing an easily soluble component and a hardly soluble component at an appropriate ratio, the depths of the gaps (G) are adjusted.

In the roughening of the surface (4*a*) of the insulating layer 4, the surface (4*a*) is roughened to have an arithmetic mean roughness (Ra) of, for example, 0.05 μm or more and 0.5 μm or less. The surface (4*a*) may be roughened to have an arithmetic mean roughness (Ra) of 0.05 μm or more and 0.5 μm or less and include a region in which 5 or more first inorganic filler particles 51 exist per 10 μm.

The roughening treatment of the surface (4*a*) of the insulating layer 4 may be performed using a common procedure and under a common condition. However, for example, in a roughening treatment based on an alkaline permanganate solution treatment, a swelling treatment using a swelling liquid, an oxidation treatment using an oxidizing agent (substantial roughening treatment), and a neutralization treatment using a neutralizing liquid may be performed. As the swelling liquid, for example, a sodium hydroxide solution or a potassium hydroxide solution is used. The insulating layer 4 is exposed to the swelling liquid at a predetermined temperature for a predetermined time.

As the oxidizing agent, for example, an alkaline permanganate solution containing permanganate at a predetermined concentration is used. The insulating layer 4 is exposed to the solution at a predetermined temperature for a predetermined time. As the neutralizing liquid, an acidic aqueous solution is used. The surface (4*a*) of the insulating layer 4 roughened by the oxidation treatment is exposed to the neutralizing liquid at a predetermined temperature for a predetermined time. For example, conditions such as a treatment time, a temperature of a treatment liquid, and/or a concentration of a main component in the treatment liquid in each treatment during the series of roughening treatments are appropriately selected. As a result, the surface (4*a*) of the insulating layer 4 is roughened such that the surface (4*a*) has the desired arithmetic mean roughness (Ra) described above, and preferably, in at least a portion of the surface (4*a*), the first inorganic filler particles 51 are provided at a desired density equal to or higher than the density (C) (five first inorganic filler particles 51 per 10 μm). Further, by selecting these conditions, gaps (G) having depths (D1) of 0.1 µm or more and 0.5 µm or less may be formed. After the roughening of the surface (4a) of the insulating layer 4, cleaning may be performed. For example, the wiring substrate during manufacturing is cleaned by ultrasonic cleaning. By ultrasonic cleaning, a state of the surface (4a) of the insulating layer 4 may be further brought closer to a desired state. For example, it is possible that excessive first inorganic filler particles 51 on the surface (4a) are removed by ultrasonic cleaning, and instead, the recesses (4c) are formed. Further, the resin part 41 excessively existing on the surface (4a) may be removed.

Figure 7E:
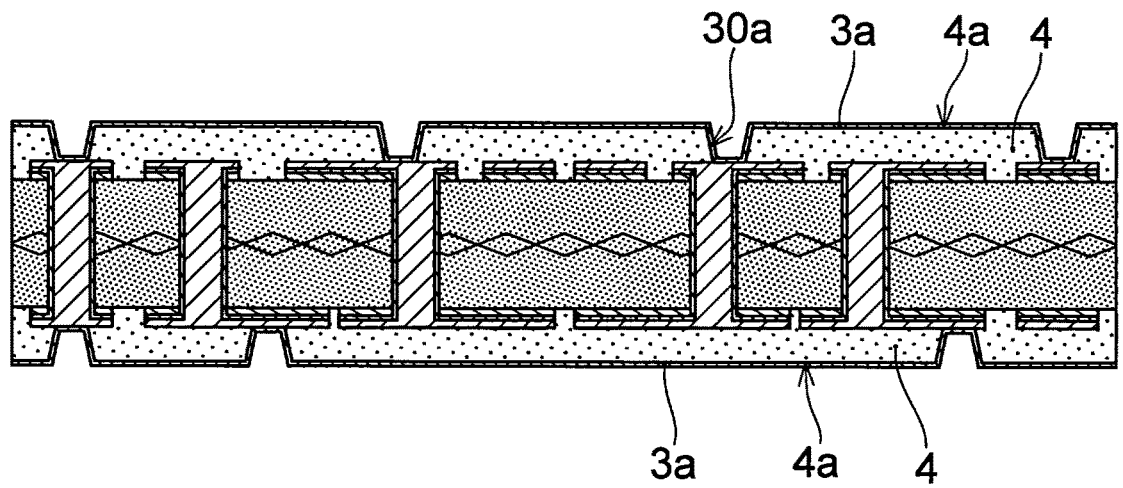
FIG. 7E is a cross-sectional view illustrating an example of a manufacturing process of a wiring substrate according to an embodiment of the present invention.
Figure 7F:
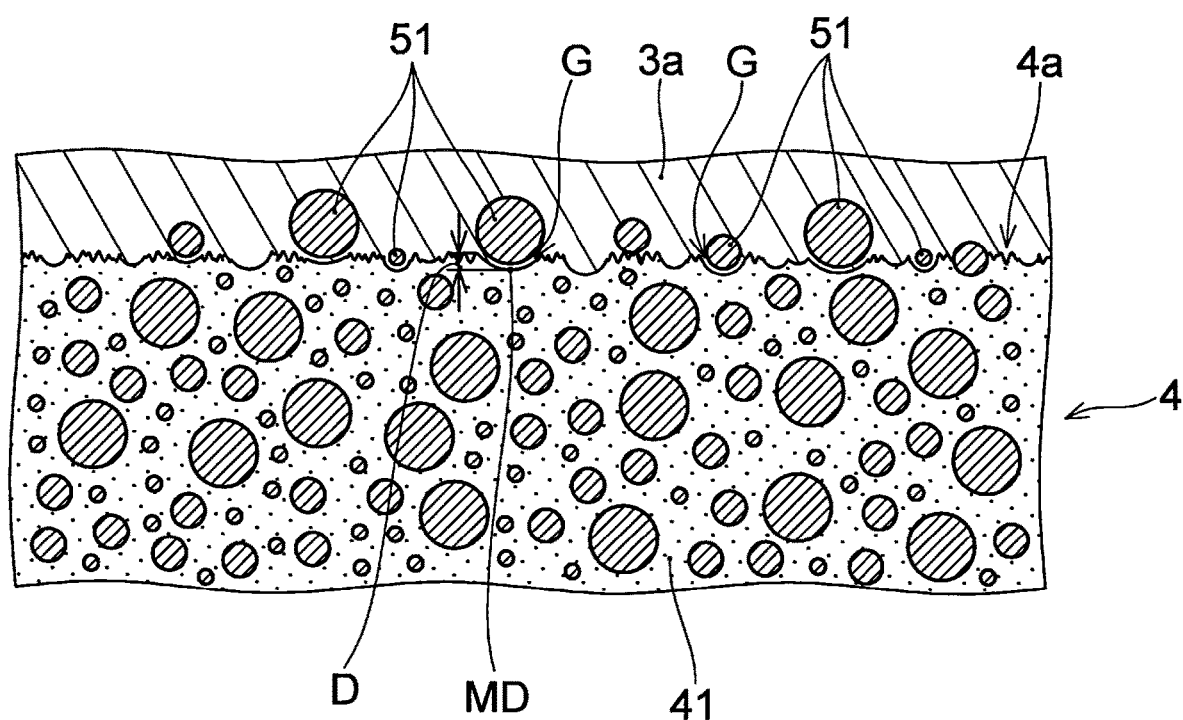
FIG. 7F is a cross-sectional view illustrating an example of a manufacturing process of a wiring substrate according to an embodiment of the present invention.
Figure 7G:
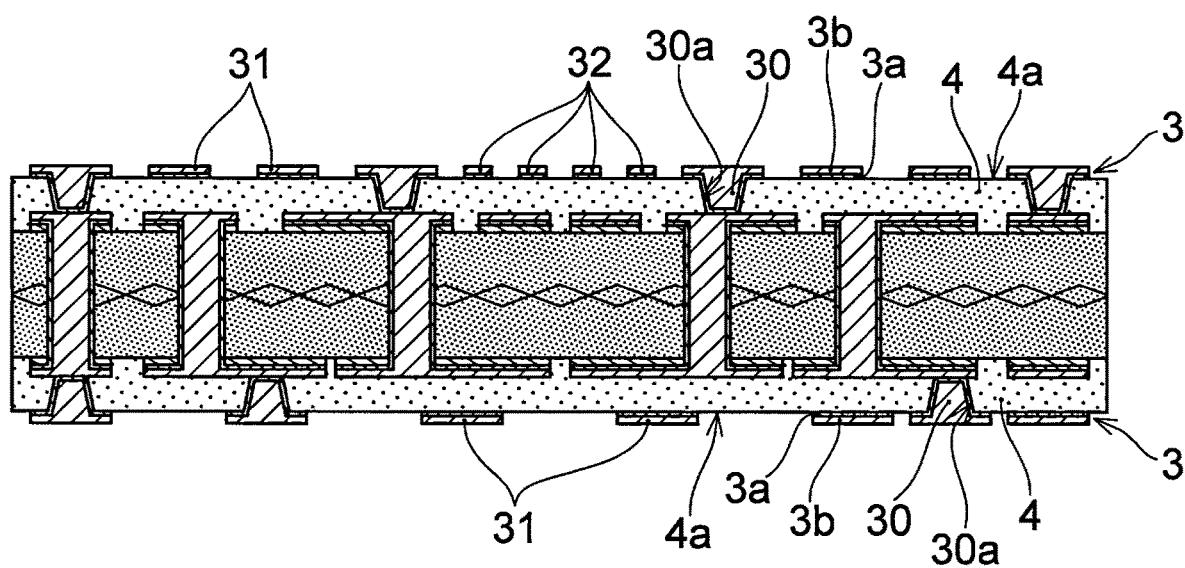
FIG. 7G is a cross-sectional view illustrating an example of a manufacturing process of a wiring substrate according to an embodiment of the present invention.

As illustrated in FIGS. 7E-7G, the metal film (3a) is formed on the surface (4a) of the insulating layer 4, and the gaps (G) between the first inorganic filler particles 51 and the resin part 41 are filled with a part of the metal film (3a). Then, the conductor layer 3 is formed. In the example of FIGS. 7E-7G, the conductor layer 3 is formed using a semi-additive method. FIG. 7F illustrates an enlarged cross section of an interface portion between the insulating layer 4 and the metal film (3a) in the state of FIG. 7E.

The metal film (3a) is formed on the surface (4a) of the insulating layer 4 and on the entire inner walls of the through holes (30a) using any metal such as copper or nickel. Further, as illustrated in FIG. 7F, the metal film (3a) is also formed in the gaps (G) between the first inorganic filler particles 51 and the resin part 41 of the insulating layer 4. By forming the metal film (3a) also in the gaps (G) between the first inorganic filler particles 51 and the resin part 41, the adhesion strength between the insulating layer 4 and the conductor layer 3 (see FIG. 7G) is improved. Then, the part of the metal film (3a) filling the gaps (G) with depths (D1) (see FIG. 7D) in the above-described range has distances (D) of 0.1 µm or more and 0.5 µm or less between the deepest parts (MD) thereof and the surface (4a) of the insulating layer 4. Therefore, in removing an unwanted portion of the metal film (3a) in a subsequent process, the unwanted portion of the metal film (3a) to be removed is unlikely to remain.

The metal film (3a) is formed, for example, using any method such as electroless plating or sputtering. However, the metal film (3a) is preferably formed by electroless plating. In the formation of the metal film (3a) by electroless plating, the metal film (3a) is easily formed also in the gaps (G) between the first inorganic filler particles 51 and the resin part 41 of the insulating layer 4.

As illustrated in FIG. 7G, after the formation of the metal film (3a), the plating film (3b) in a desired pattern is formed on the metal film (3a). The plating film (3b) is formed by pattern plating including electrolytic plating using the metal film (3a) as a power feeding layer. As a result, the via conductors 30 are formed in the through holes (30a). The plating film (3b) is formed, for example, using the same material as that of the metal film (3a) such as copper or nickel.

After that, an unwanted portion of the metal film (3a) that is not covered by the plating film (3b) is removed, for example, by etching. As a result, the conductor layer 3 that has a two-layer structure and includes the desired conductor patterns such as the conductor pads 31 and the wiring patterns 32 is formed. In the present embodiment, as described above, since the distances between the deepest parts (MD) of the part of the metal film (3a) (see FIG. 7F) and the surface (4a) of the insulating layer 4 are less than 0.5 µm, the unwanted portion of the metal film (3a) is easily and properly removed.

After that, the solder resist 6 (see FIG. 1) is formed, for example, by forming a resin layer containing a photosensitive epoxy resin or the like on the conductor layer 3 and the insulating layer 4. The openings exposing the conductor pads 31 are provided in the solder resist 6, for example, by exposure and development. The surface protection film (not illustrated in the drawings) may be formed on the conductor pads 31 by electroless plating, solder leveling, or the like. Through the above processes, the wiring substrate 100 in the example of FIG. 1 is completed.

The wiring substrate of the embodiment is not limited to those having the structures illustrated in the drawings and those having the structures, shapes, and materials exemplified herein. As described above, the wiring substrate of the embodiment may have any laminated structure. For example, the wiring substrate of the embodiment may be a coreless substrate that does not include a core substrate. The wiring substrate of the embodiment may have any number of conductor layers and any number of insulating layers. The conductor layer 3 does not have to include a plating film (3b) formed of an electrolytic plating film, and may include, for example, only the metal film (3a) formed of an electroless plating film.

Japanese Patent Application Laid-Open Publication No. 2017-199703 describes a wiring substrate that includes an insulating layer in which inorganic insulating filler particles are contained in a thermosetting resin. A surface of the insulating layer is roughened to an extent that the inorganic insulating filler particles are not exposed. An electroless copper plating film is formed on the roughened surface. After an electrolytic copper plating film of a predetermined pattern is formed on the electroless copper plating film, an exposed portion of the electroless copper plating film is removed.

In the wiring substrate described in Japanese Patent Application Laid-Open Publication No. 2017-199703, the electroless copper plating film is formed on the uneven surface of the insulating layer after roughening, and the insulating layer and the electroless copper plating film are anchored by an anchor effect. However, when the surface roughness of the insulating layer is small, a sufficient anchor effect is not obtained, and adhesion strength between the insulating layer and the electroless copper plating film may decrease. On the other hand, when the surface roughness of the insulating layer is large, the electroless copper plating film formed deep in the irregularities on the surface of the insulating layer may remain without being removed in a portion exposed from the electrolytic copper plating film.

A wiring substrate according to an embodiment of the present invention includes: an insulating layer that contains multiple inorganic filler particles and a resin part surrounding the multiple inorganic filler particles; and a conductor layer that includes a metal film formed on a surface of the insulating layer and includes a predetermined conductor pattern. The multiple inorganic filler particles include first inorganic filler particles that each include a portion exposed on the surface and are each at least partially separated from the resin part. A part of the metal film enters between the first inorganic filler particles and the resin part from the surface. A distance between a deepest part of the part of the metal film from the surface and the surface is 0.1 µm or more and 0.5 µm or less.

According to an embodiment of the present invention, it may be possible to improve adhesion strength between an insulating layer and a conductor layer while suppressing deterioration in insulation between conductor patterns.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
an insulating layer comprising inorganic filler particles and resin; and
a conductor layer comprising a metal film formed on a surface of the insulating layer and having a conductor pattern,
wherein the inorganic filler particles include first inorganic filler particles such that each of the first inorganic filler particles has an exposed portion exposed from the surface of the insulating layer and is at least partially separated from the resin, and the conductor layer is formed such that a part of the metal film is penetrating in a gap or gaps formed between the exposed portion of each of the first inorganic filler particles and the resin forming the surface of the insulating layer and that a distance between the surface of the insulating layer and the surface of the insulating layer at a deepest part of the part of the metal film is in a range of 0.1 µm to 0.5 µm.

2. The wiring substrate according to claim 1, wherein the insulating layer is formed such that the surface of the insulating layer includes a region in which 5 or more of the first inorganic filler particles exist per 10 µm.

3. The wiring substrate according to claim 1, wherein the conductor layer has a plurality of wiring patterns having a minimum wiring interval in a range of 3 µm to 15 µm.

4. The wiring substrate according to claim 3, wherein the conductor layer is formed such that a minimum wiring width of the wiring patterns is in a range of 3 µm to 15 µm.

5. The wiring substrate according to claim 1, wherein the conductor layer is formed such that the metal film is an electroless plating film.

6. The wiring substrate according to claim 1, wherein the insulating layer is formed such that a content rate of the inorganic filler particles in the insulating layer is in a range of 65% to 80%.

7. The wiring substrate according to claim 1, wherein the insulating layer has recesses on the surface of the insulating layer and is formed such that the first inorganic filler particles are partially formed in the recesses on the surface of the insulating layer and that the part of the metal film is in deepest parts of the recesses.

8. The wiring substrate according to claim 1, wherein the insulating layer is formed such that the surface of the insulating layer has an arithmetic mean roughness in a range of 0.05 µm to 0.5 µm.

9. The wiring substrate according to claim 2, wherein the conductor layer has a plurality of wiring patterns having a minimum wiring interval in a range of 3 µm to 15 µm.

10. The wiring substrate according to claim 9, wherein the conductor layer is formed such that a minimum wiring width of the wiring patterns is in a range of 3 µm to 15 µm.

11. The wiring substrate according to claim 2, wherein the conductor layer is formed such that the metal film is an electroless plating film.

12. The wiring substrate according to claim 2, wherein the insulating layer is formed such that a content rate of the inorganic filler particles in the insulating layer is in a range of 65% to 80%.

13. The wiring substrate according to claim 2, wherein the insulating layer has recesses on the surface of the insulating layer and is formed such that the first inorganic filler particles are partially formed in the recesses on the surface of the insulating layer and that the part of the metal film is in deepest parts of the recesses.

14. The wiring substrate according to claim 2, wherein the insulating layer is formed such that the surface of the insulating layer has an arithmetic mean roughness in a range of 0.05 µm to 0.5 µm.

15. The wiring substrate according to claim 3, wherein the conductor layer is formed such that the metal film is an electroless plating film.

16. The wiring substrate according to claim 3, wherein the insulating layer is formed such that a content rate of the inorganic filler particles in the insulating layer is in a range of 65% to 80%.

17. The wiring substrate according to claim 3, wherein the insulating layer has recesses on the surface of the insulating layer and is formed such that the first inorganic filler particles are partially formed in the recesses on the surface of the insulating layer and that the part of the metal film is in deepest parts of the recesses.

18. The wiring substrate according to claim 3, wherein the insulating layer is formed such that the surface of the insulating layer has an arithmetic mean roughness in a range of 0.05 µm to 0.5 µm.

19. The wiring substrate according to claim 4, wherein the insulating layer is formed such that a content rate of the inorganic filler particles in the insulating layer is in a range of 65% to 80%.

20. The wiring substrate according to claim 4, wherein the insulating layer has recesses on the surface of the insulating layer and is formed such that the first inorganic filler particles are partially formed in the recesses on the surface of the insulating layer and that the part of the metal film is in deepest parts of the recesses.

* * * * *